United States Patent [19]

Imai

[11] Patent Number: 4,636,865
[45] Date of Patent: Jan. 13, 1987

[54] SOLID STATE IMAGE SENSOR

[75] Inventor: Masaharu Imai, Ina, Japan

[73] Assignee: Olympus Optical Co., Ltd., Tokyo, Japan

[21] Appl. No.: 720,805

[22] Filed: Apr. 8, 1985

[30] Foreign Application Priority Data

Apr. 27, 1984 [JP] Japan ............................ 59-85903

[51] Int. Cl.[4] ............................................. H04N 3/12
[52] U.S. Cl. ................................... 358/213; 357/24; 357/22
[58] Field of Search .................... 358/212, 213; 357/24 LR, 24, 30, 22, 43, 22 C, 22 B; 358/578

[56] References Cited

U.S. PATENT DOCUMENTS

| | | | |
|---|---|---|---|
| 4,198,648 | 4/1980 | Nishizawa | 357/43 |
| 4,233,632 | 11/1980 | Akiyama | 358/212 |
| 4,338,618 | 7/1982 | Nishizawa | 357/43 |
| 4,496,980 | 1/1985 | Pfleiderer et al. | 358/212 |
| 4,504,865 | 3/1985 | Nishizawa et al. | 358/213 |
| 4,518,863 | 5/1985 | Fukuoka et al. | 250/578 |
| 4,524,391 | 6/1985 | Nishizawa et al. | 358/213 |
| 4,542,409 | 9/1985 | Ochi | 358/212 |
| 4,547,806 | 10/1985 | Herbst et al. | 358/212 |
| 4,589,024 | 5/1986 | Koch et al. | 358/213 |
| 4,589,027 | 5/1986 | Nakamura et al. | 358/213 |

Primary Examiner—Robert G. Lev
Attorney, Agent, or Firm—Parkhurst & Oliff

[57] ABSTRACT

A solid state image sensor including a number of pixels arranged in a matrix form between row lines and column lines, successive pixels being read out by an XY address method to derive an image signal, each pixel being formed by a normally-on type static induction transistor and a control transistor having a source-drain passage connected to a gate of the static induction transistor, the control transistor being selectively made conductive during a horizontal blanking period to discharge an excess amount of photocarriers stored in the gate of static induction transistor through the source-drain passage.

10 Claims, 63 Drawing Figures

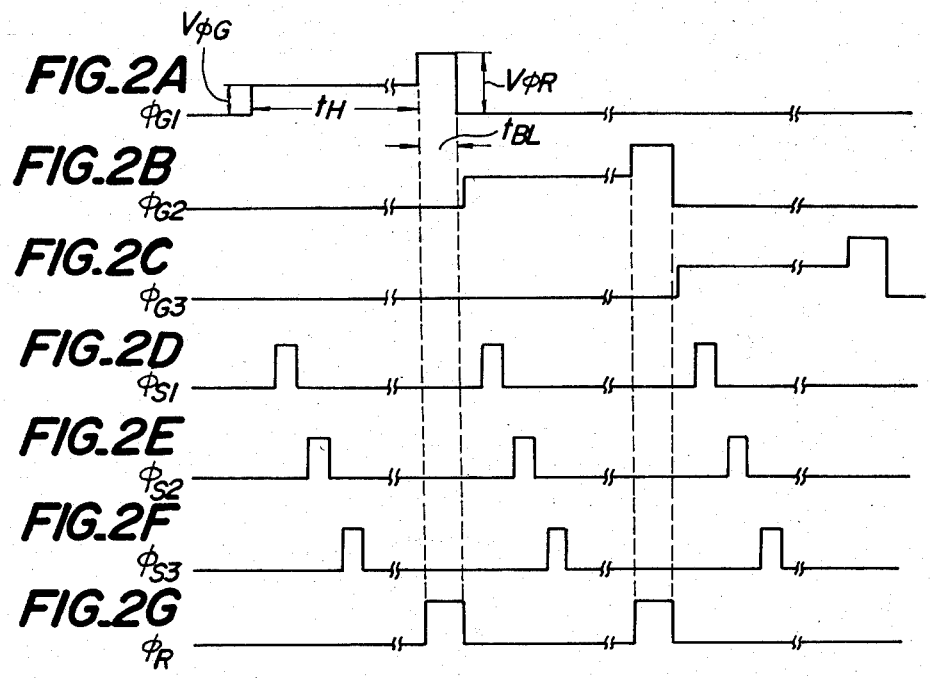
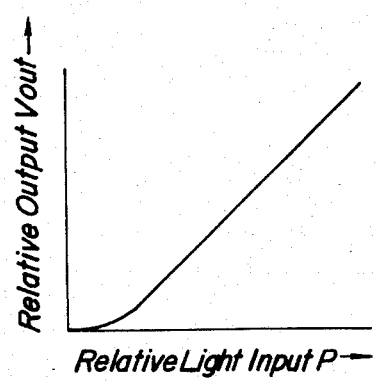
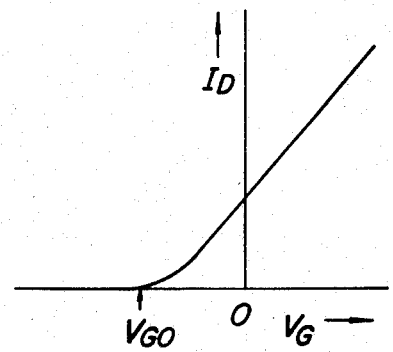
FIG.3A
FIG.3B

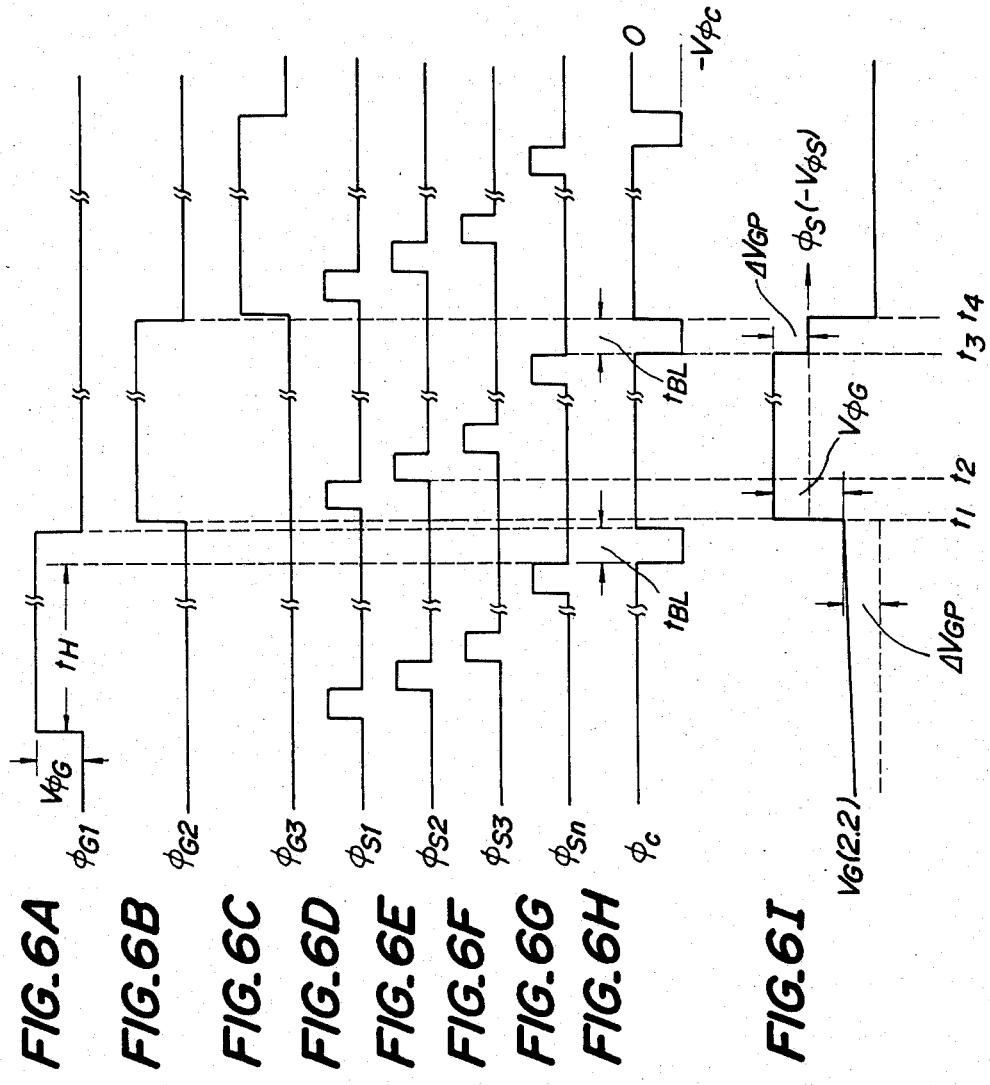

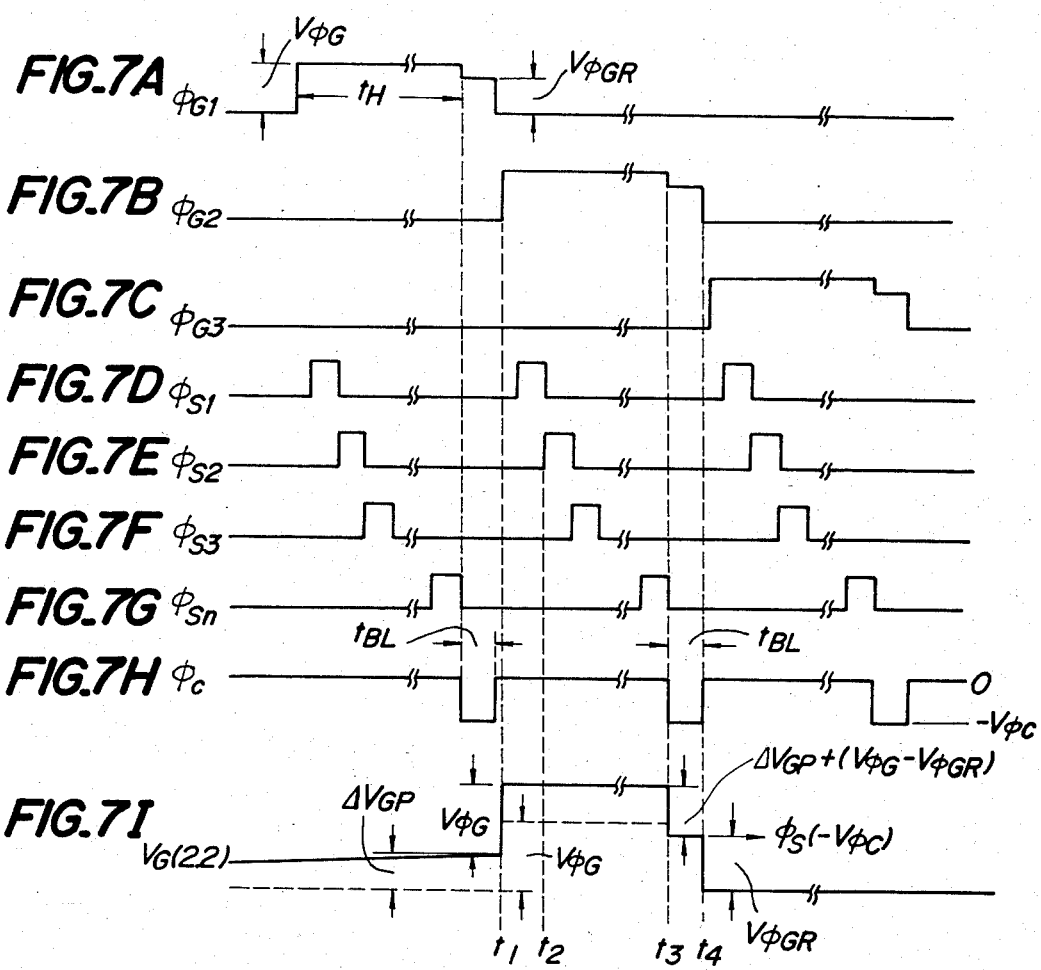
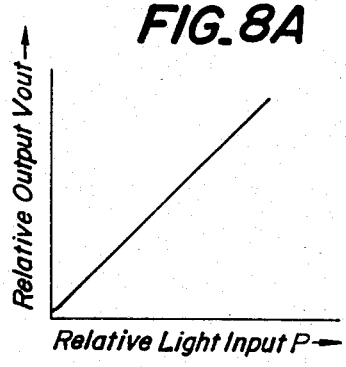
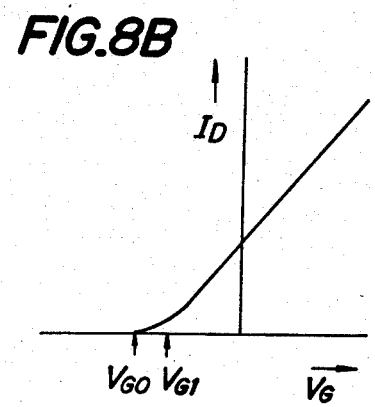

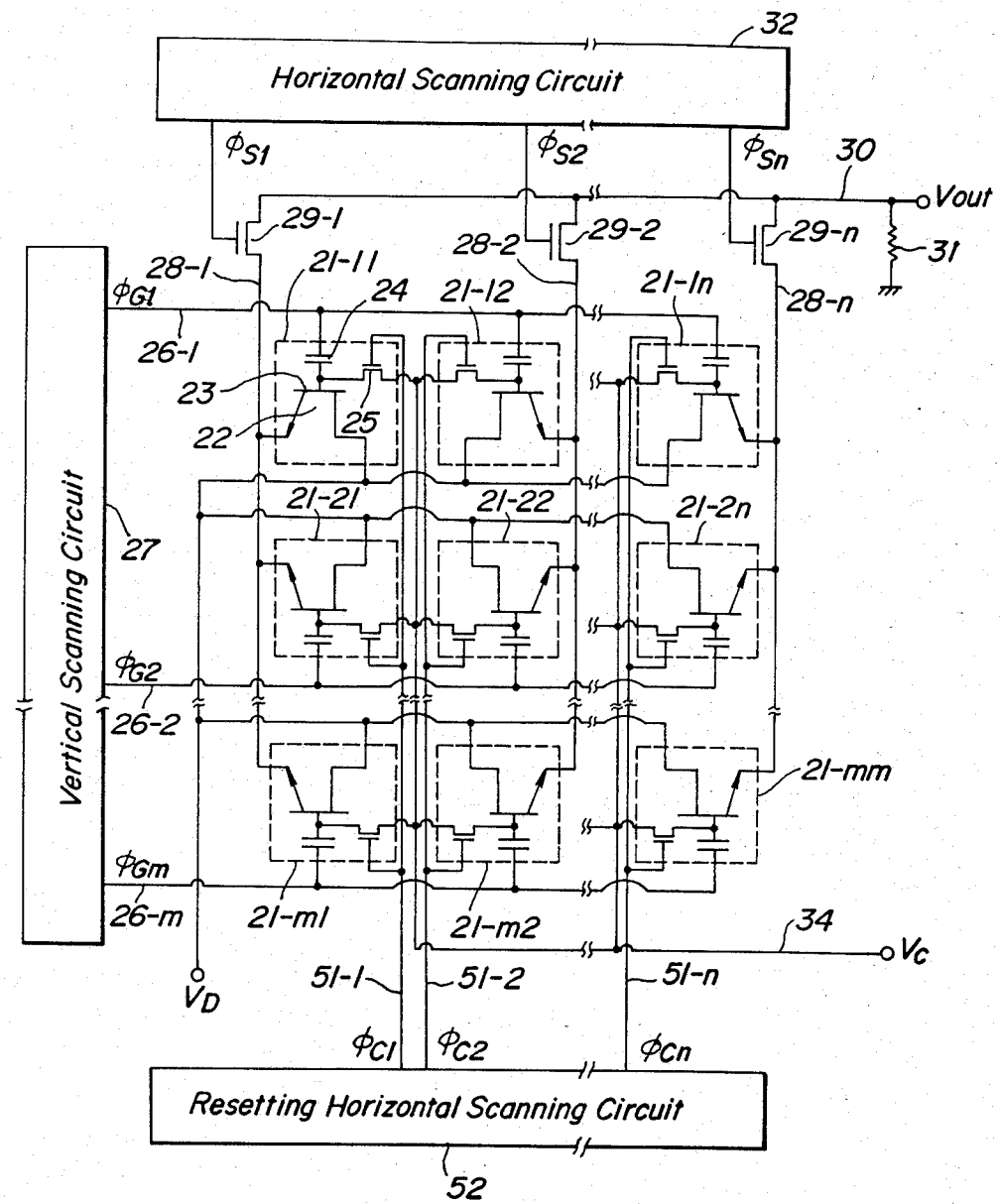

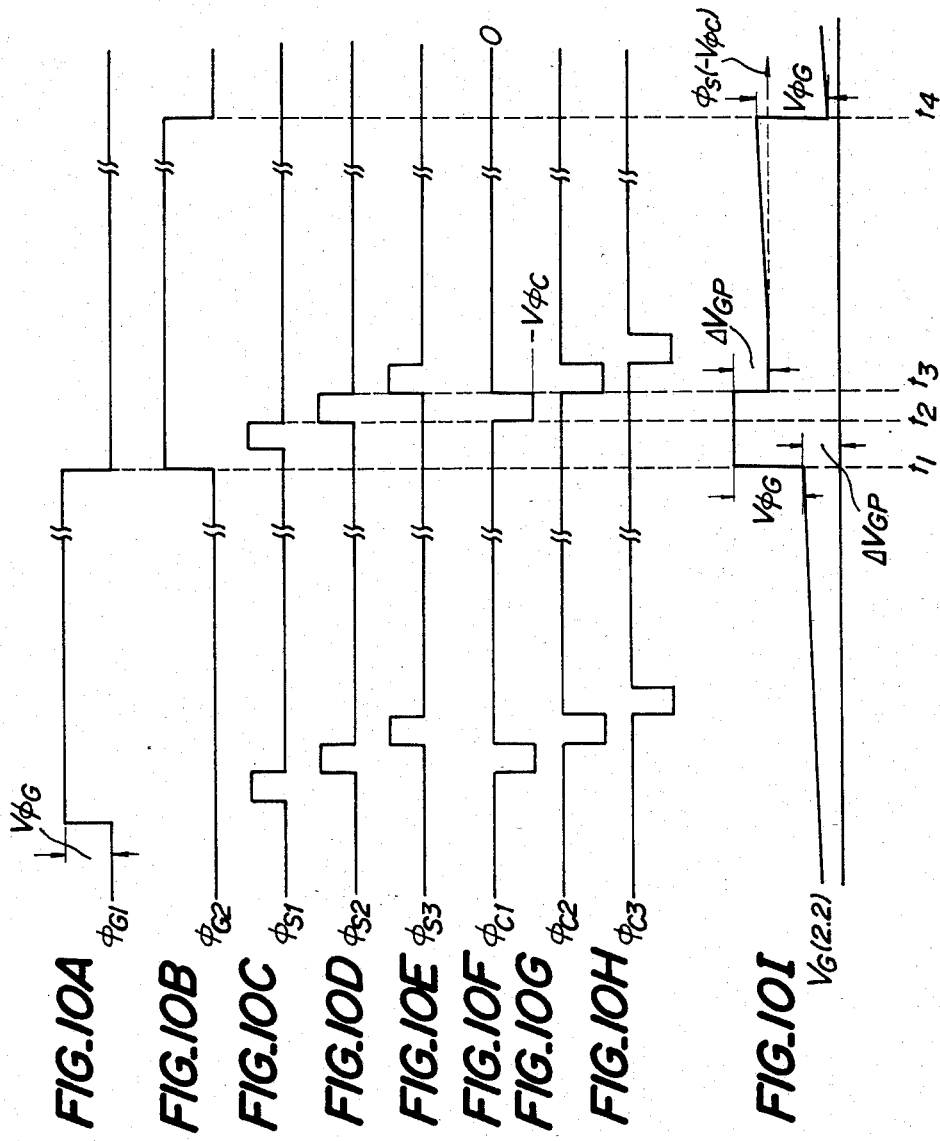

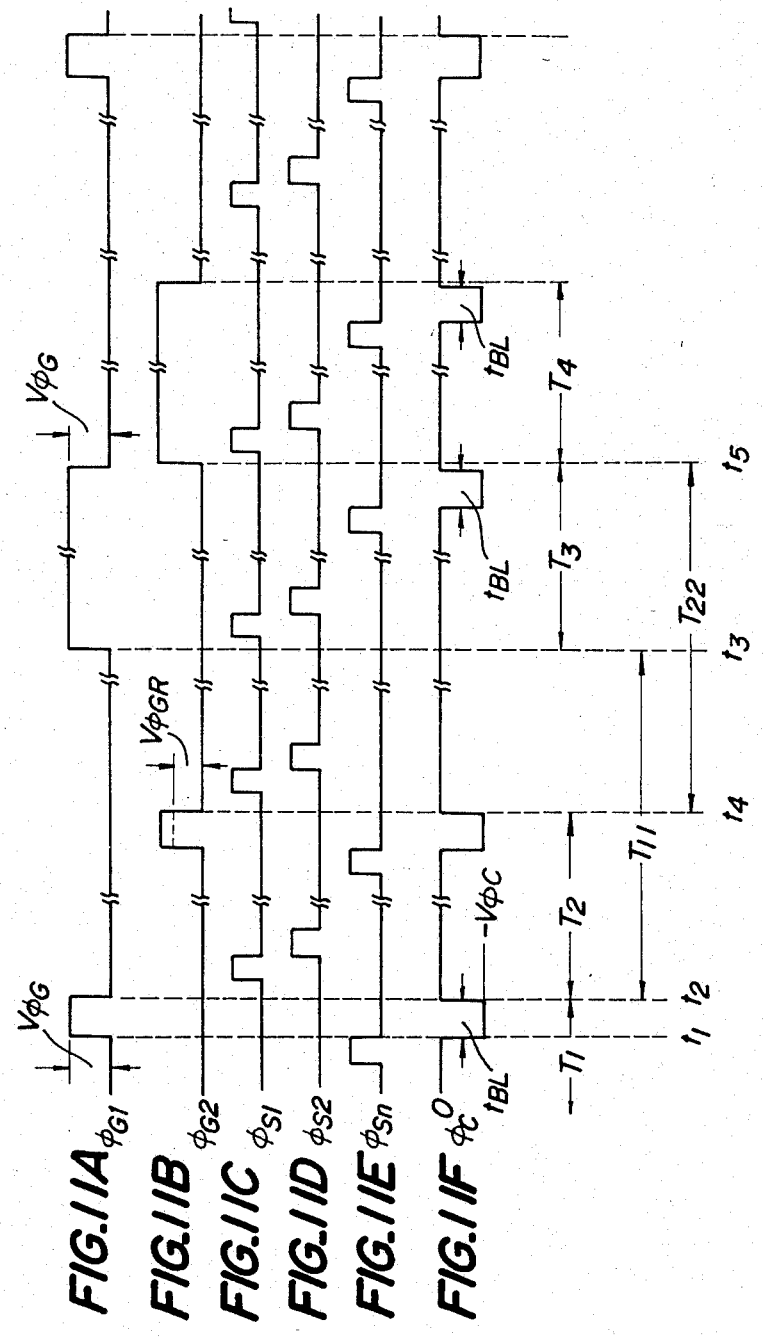

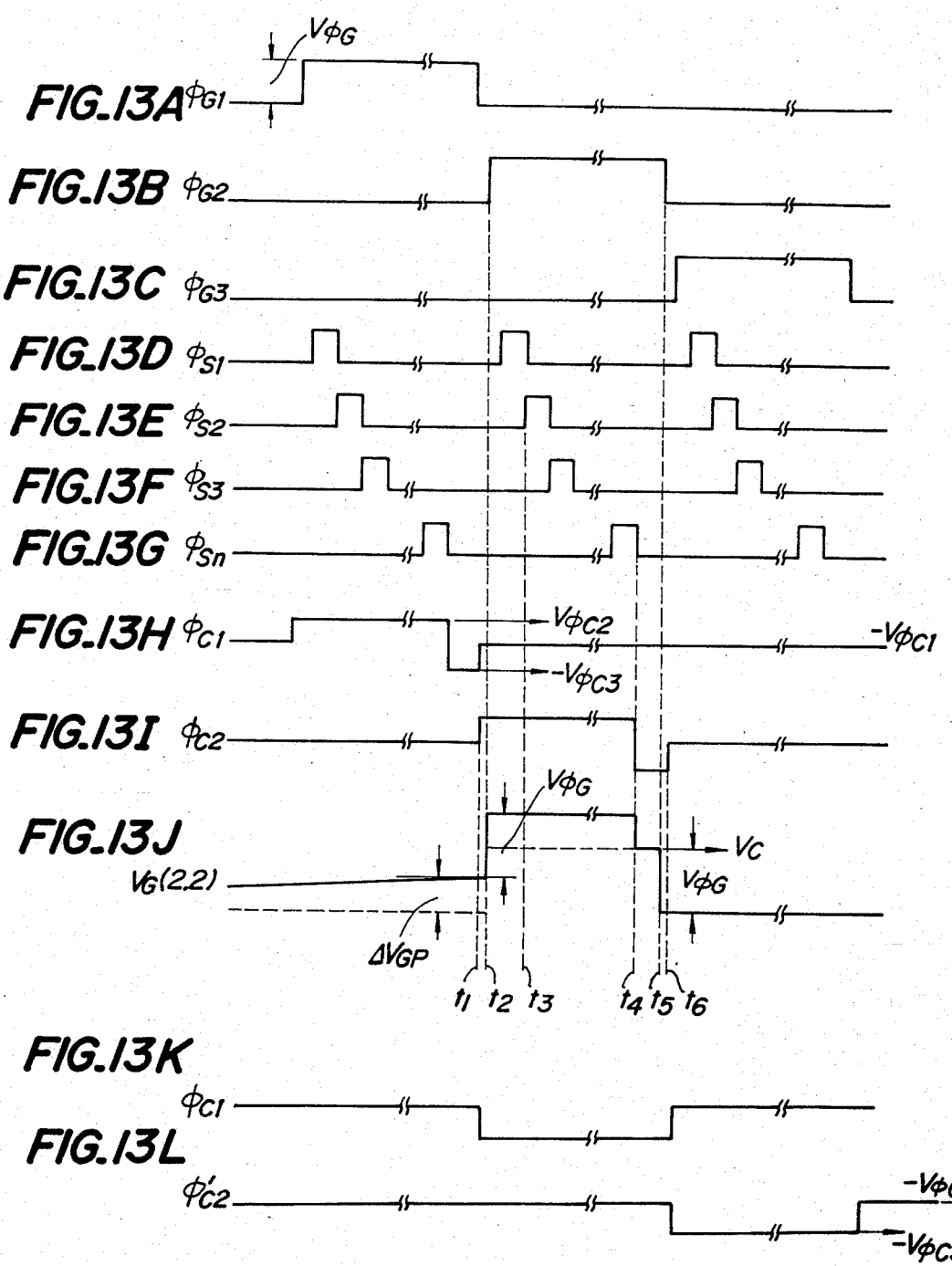

1

SOLID STATE IMAGE SENSOR

BACKGROUND OF THE INVENTION

The present invention relates to a solid state image sensor comprising a plurality of pixels formed by static induction transistors having both photoelectric converting function and switching function.

Heretofore, there have been proposed various solid state image sensors comprising static induction transistors (hereinafter abbreviated as SIT). For instance, there has been proposed a solid state image sensor comprising normally-off type SITs which are in cut-off condition under the zero gate bias. In such a solid state image sensor comprising normally-off type SITs, since a signal is read out at a charge injection region, it is possible to obtain a spike-like signal having a large amplitude. However, an effective dynamic range of a gate potential during a readout period is limited to a relatively small range from a positive pinch-off voltage at which the SIT begins to conduct to a gate voltage at which the charge injection from a gate to a source occurs. Therefore, the effective dynamic range of incident light is small and the saturated exposure value is small.

In order avoid the drawback mentioned above, there has been proposed in U.S. patent application Ser. No. 647,169 filed on Sept. 4, 1984 a solid state image sensor comprising normally-on type SITs which are made conductive under the zero gate bias condition.

FIGS. 1A and 1B show an embodiment of the solid state image sensor comprising normally-on type SITs as proposed in the above mentioned Patent Application. A SIT 1 shown in FIG. 1A comprises an n+ or n substrate 2 which serves as a drain of the SIT, an n− epitaxial layer 3 which is grown on the substrate 2, and serves as a channel, an n+ source region 4 and a p+ gate region 5 formed in the epitaxial layer 3 by means of, for example, thermal diffusion, a source electrode 6 connected to the source region 4 and a gate electrode 8 arranged above the gate region 5 over an insulating film 7 such as SiO2 to form a gate capacitor 9. The SIT 1 is isolated from adjacent SITs by means of an isolation region 10 formed by a burried insulation substance. A number of SITs are arranged in a matrix on the same substrate.

FIG. 1B is a circuit diagram illustrating the whole construction of a solid state image sensor comprising SITs shown in FIG. 1A. To drains (substrate) of SITs 1-11 to 1-mn forming pixels arranged in a matrix are commonly applied a video voltage $V_D$, and to gate electrodes of SITs 1-11 to 1-1n; . . . ; 1-m1 to 1-mm arranged in the X direction, i.e. in row are connected row lines 11-1 to 11-m, respectively which lines are then connected to a vertical scanning circuit 12 are applied row selection signals $\phi_{G1}$ to $\phi_{Gm}$. Source electrodes of SITs 1-11 to 1-m1; . . . ; 1-1n to 1-mn arranged in the Y direction, i.e. in column, are connected to column lines 13-1 to 13-n, respectively, having first ends connected to ground via respective column selection transistors 14-1 . . . 14-n, a common video line 15 and a load resistor 16. To gates of the column selection transistors 14-1 to 14-n are applied column selection signals $\phi_{s1}$ to $\phi_{sn}$, respectively, from a horizontal scanning circuit 17. The other ends of the column selection lines 13-1 to 13-n are connected to ground via respective reset transistors 18-1 . . . 18-n. A reset signal $\phi_R$ is commonly applied to the gates of reset transistors 18-1 . . . 18-n.

FIGS. 2A to 2G illustrate waveforms of the signals applied to the row lines 11-1 to 11-m, column selection transistors 14-1 to 14-n and reset transistors 18-1 to 18-n. As illustrated in FIGS. 2A to 2G, in this solid state image sensor, the successive pixels are readout by successively selecting the row lines 11-1 to 11-n as well as by successively selecting the column lines 13-1 to 13-n while a row line has been selected. During the horizontal blanking period $t_{BL}$ after signal readout period $t_H$, all the SITs belonging to a respective row line are simultaneously reset. Since each pixel is formed by a normally-on type SITs, each of the row selection signals $\phi_{G1}$ to $\phi_{Gm}$ has three levels so as to effect a readout at a negative pinch-off voltage $V_{\phi G}$.

During the horizontal blanking period $t_{BL}$, all the column lines 13-1 to 13-n are set to zero voltage by means of the reset signal $\phi_R$ applied simultaneously to the reset transistors 18-1 to 18n. At the same time, a row selection signal $\phi_{G1}$ applied to a row line, for instance, a first row line 11-1, has the maximum voltage $V_{\phi R}$, and therefore the floating gate of all the SITs 1-11 to 1-1n connected to the respective row line 11-1, i.e. a junction between the gate region and gate capacitor, is forward biased with respect to the source connected to the column lines 13-1 to 13-n having zero potential. Therefore, photocarriers (holes) induced by a light input and stored in the gate region flow into the source region and the potential of the floating gate with respect to the source becomes equal to a built-in voltage $V_{bi}$ between the gate and source. In this manner, the gates of SITs belonging to one row are reset and photocarriers stored in the gates are discharged.

In each row line, when the application of the voltage $V_{\phi R}$ ends, the gate region of the SIT belonging to the respective row is reverse biased substantially by $-V_{\phi R}$ with respect to the built-in voltage $V_{bi}$. More accurately, the gate region is reverse biased by $$-\frac{C_G}{C_J + C_G} V_{\phi R}$$

where $C_G$ is a capacitance of the gate capacitor 9, and $C_J$ is a stray junction capacitance of the floating gate with respect to the source and channel. Therefore, the gate potential of the respective SIT becomes equal to $$V_{bi} - \frac{C_G}{C_J + C_G} \cdot V_{\phi R}$$

During the signal readout period $t_H$, since the voltage $V_{\phi G}$ is applied to a selected row line, the potential of the floating gates of SITs connected to the respective row line is increased substantially by $V_{\phi G}$ due to capacitive coupling. Until the time instant of signal readout, holes of electron-hole pairs induced by the incident light in the epitaxial layer have been stored in the gate region from a time instant when the respective row was reset last. Therefore, the floating gate potential is increased by $\Delta V_{Gp} = Q_p / C_G$, wherein $Q_p$ is an integrated amount of holes. Thus, the gate potential at the time of readout becomes substantially equal to $(V_{bi} - V_{\phi R}) + V_{\phi G} + Q_p / C_G$. Now it is assumed that the pinch-off voltage $V_{GO}$ of respective SIT is set to $(V_{bi} - V_{\phi R} + V_{\phi G})$. Then, the amount of the gate potential exceeding the pinch-off voltage $V_{GO}$ becomes equal to the potential increment $\Delta V_{GP}$ due to the integration of the induced photocarriers for an image pick-up period. In this manner, it is possible to obtain a relative output voltage $V_{out}$ in proportion to a relative light input P as shown in FIG. 3A, and a single current $I_D$ flows in proportion to the gate potential $V_G$ as illustrated in FIG. 3B.

In the above explained solid state image sensor, after the reset of the gate potential, but before the signal readout, when a strong light is incident, the increment $\Delta V_{Gp}$ of gate potential due to the accumulation of a large amount of photocarriers might exceed $V_{\phi G}$. Then, the floating gate potential $V_G$ becomes as follows.

$$V_G = V_{bi} - V_{\phi R} + \Delta V_{Gp} > V_{GO}$$

Therefore, even if the SIT is not selected, the gate potential $V_G$ might exceed the pinch-off voltage $V_{GO}$ and thus, the SIT is erroneously made conductive. Then, a current readout from the non-selected SIT which is erroneously made conductive is superimposed upon a signal current readout from a correctly selected SIT and flows through the load resistor 16. In this manner, it is no longer possible to effect image pick-up operation accurately.

In order to avoid the above drawback, the inventor has considered that the maximum allowable increment $\Delta V_{Gp}$ of gate potential is made higher by increasing the row selection voltage $V_{\phi G}$ and reset voltage $V_{\phi R}$, while the pinch-off voltage $V_{GO}$ remains unchanged. However, this means that the saturation light exposure value is changed and thus, freedom of designing the solid state image sensor is limited. Moreover, since said allowable increment can not be made sufficiently high, if much stronger light is made incident upon the solid state image sensor, the above drawback might still occur. Therefore, the above explained measure can not provide a fundamental solution for the above problem.

As explained above, in the solid state image sensor comprising normally-on type SITs, although it is possible to obtain a wider effective range of SIT gate potential and thus a wider range of incident light and a larger saturation light exposure amount as compared with a solid image sensor having normally-off type SITs, the gate potential $V_G$ might exceed the pinch-off voltage $V_{GO}$ when a large amount of light is made incident and erroneous signal current might be readout from one or more SITs which are not fully selected, but are half selected. This is sometimes called the half selection signal phenomenon.

SUMMARY OF THE INVENTION

The present invention has for its object to provide a solid state image sensor in which the half selection signal phenomenon can be effectively prevented.

It is another object of the invention to provide a solid state image sensor comprising a number of normally-on type SITs arranged in a matrix form, the solid state image sensor having a wider effective range of SIT gate potential and thus a wider dynamic range of incident light, while the solid state image sensor can accurately produce an image signal without being affected by the half selection signal phenomenon.

According to the invention, a solid state image sensor comprises
 a plurality of row lines;
 a plurality of column lines;
 a plurality of pixels, each pixel comprising a normally-on type static induction transistor having gate, source and drain and a control transistor having a source-drain passage connected to the gate of the static induction transistor, the gate storing photocarriers induced by incident light;
 means for scanning the pixels to readout an image signal by selectively making conductive the static induction transistors; and
 means for selectively making conductive one or more control transistors of pixels which are not selected by the scanning means, and for discharging through the source-drain passages of the control transistors of non-selected pixels excess amounts of stored photocarriers over a pinch-off voltage of the static induction transistors of non-selected pixels.

BRIEF DESCRIPTION OF THE DRAWINGS

FIGS. 2A to 2G are signal waveforms for explaining the operation of the solid state image sensor shown in FIGS. 1A and 1B;

FIGS. 3A and 3B depict characteristic curves of the normally-on type SIT;

FIGS. 6A to 6I are signal waveforms for explaining the operation of the solid state image sensor shown in FIG. 4;

FIGS. 7A to 7I are signal waveforms for explaining the operation of another embodiment of the solid state image sensor according to the invention;

FIGS. 8A and 8B illustrate characteristic curves of SIT of the solid state image sensor according to the invention;

FIG. 9 is a circuit diagram showing the whole construction of another embodiment of the solid state image sensor according to the invention;

FIGS. 10A to 10I are signal waveforms appearing at various points of the circuit shown in FIG. 9;

FIGS. 11A to 11F are signal waveforms for explaining the operation of still another embodiment of the solid state image sensor according to the invention;

FIGS. 13A to 13L are signal waveforms for explaining the operation of the solid state image sensor illustrated in FIG. 12.

DESCRIPTION OF THE PREFERRED EMBODIMENTS

Figure 1A:
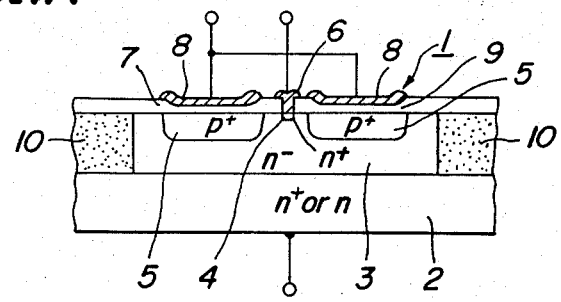
FIGS. 1A and 1B show an embodiment of a solid state image sensor comprising normally-on type SITs.
Figure 1B:
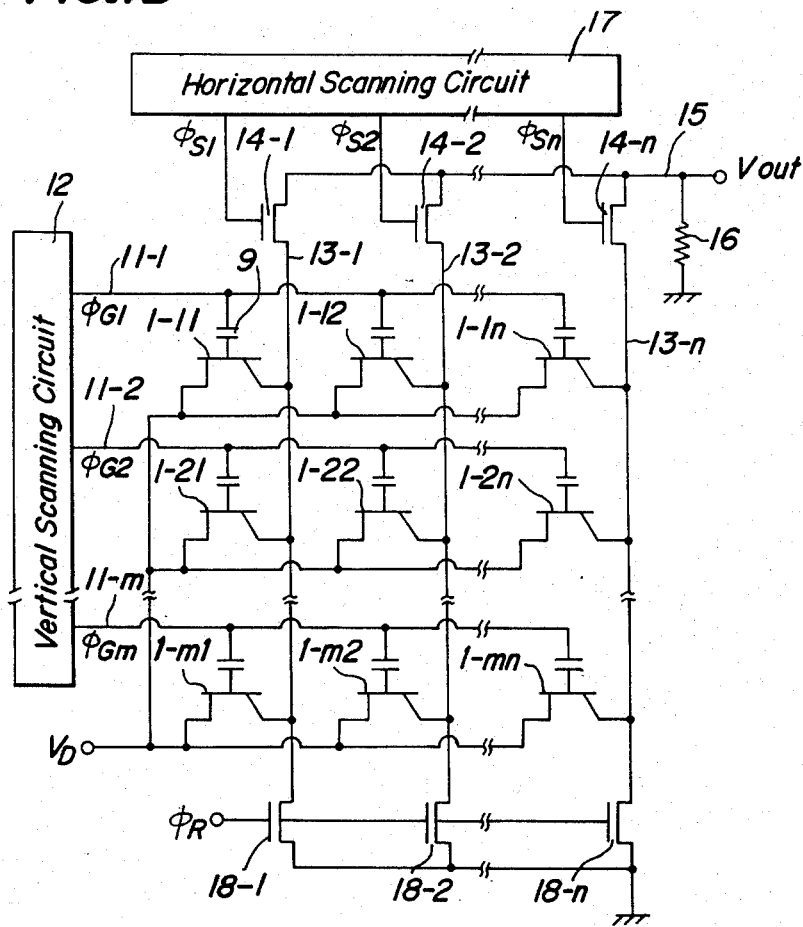
Figure 4:
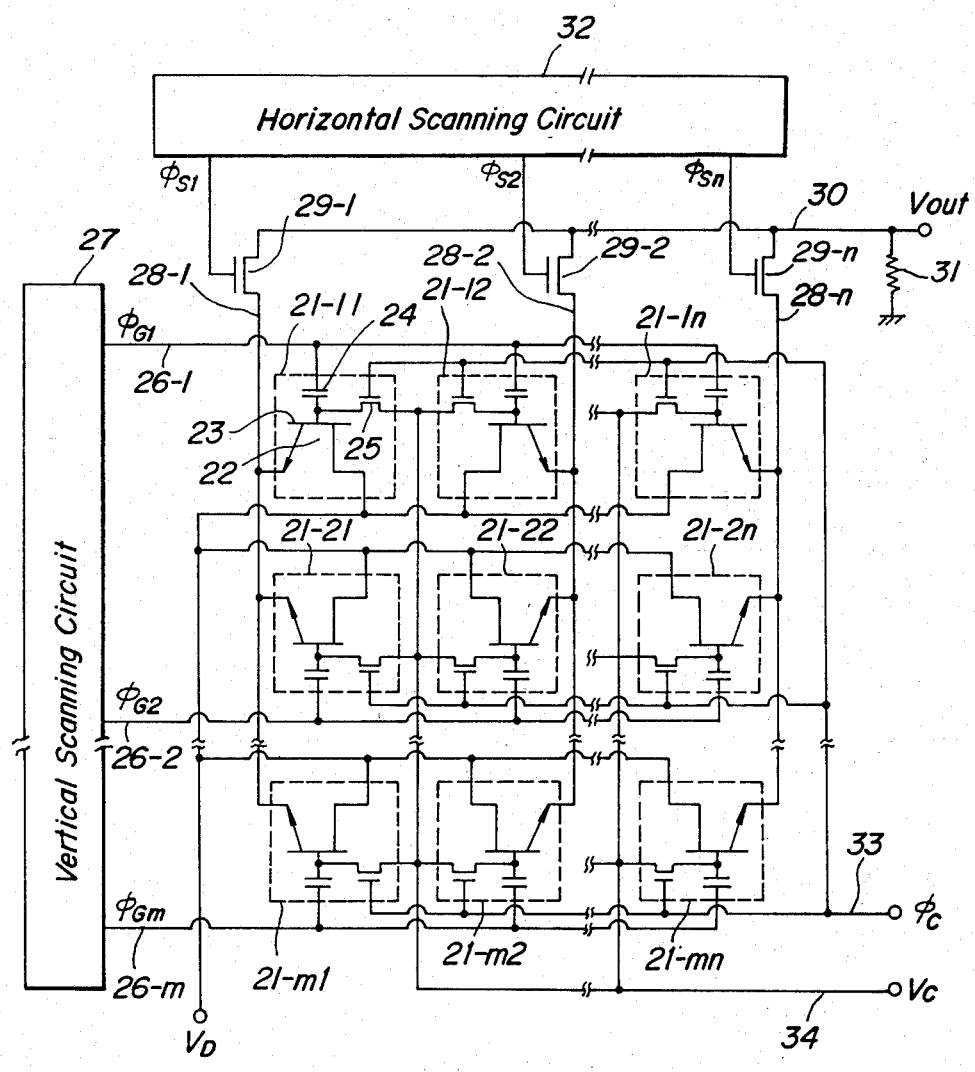
FIG. 4 is a circuit diagram showing the whole construction of an embodiment of the solid state image sensor according to the invention.

FIG. 4 is a circuit diagram showing a whole construction of an embodiment of the solid state image sensor according to the invention. The solid state image sensor comprises a number of pixels 21-11 to 21-$mn$ arranged on a substrate in a matrix form and each pixel comprises an n-channel normally-on type SIT 22, a gate capacitor 24 provided at a floating gate 23 of the SIT, and a P-channel enhancement type control transistor 25 having a source-drain passage connected to the floating gate 23 of SIT 22. To drains of the SITs is commonly applied a video voltage $V_D$. The gate capacitors 24 of SITs of pixels 21-11 to 21-1$n$; ... ; 21-$m$1 to 21-$mn$ arranged on respective rows are connected to respective row lines 26-1 ... 26-$m$ which are then connected to a vertical scanning circuit 27 to receive row selection signals $\phi_{G1}$ to $\phi_{Gm}$. Sources of SITs of pixels 21-11 to 21-m1; . . . ; 21-1n to 21-mn arranged on respective columns are connected to respective column lines 28-1 to 28-n which are then connected to ground via respective column selection transistors 29-1 to 29-n, a common video line 30 and a load resistor 31. Gates of the column selection transistors 29-1 to 29-n are connected to a horizatal scanning circuit 32 to receive respective column selection signals $\phi_{s1}$ to $\phi_{sn}$. Gates of control transistors 25 of all the pixels are commonly connected to a control gate line 33 to which a control gate signal $\phi_c$ is applied, and drains of control transistors are commonly connected to an overflow drain line 34 to which a control drain voltage $V_c$ is applied.

Figure 5A:
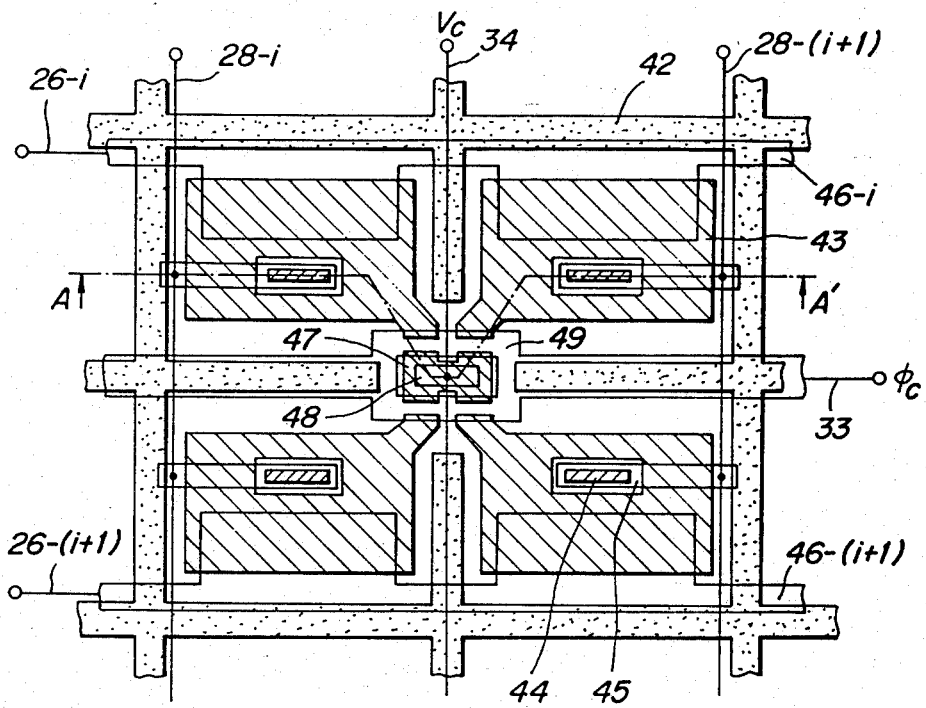
FIGS. 5A and 5B are schematic plan and sectional views, respectively, depicting the construction of the solid state image sensor of FIG. 4.
Figure 5B:
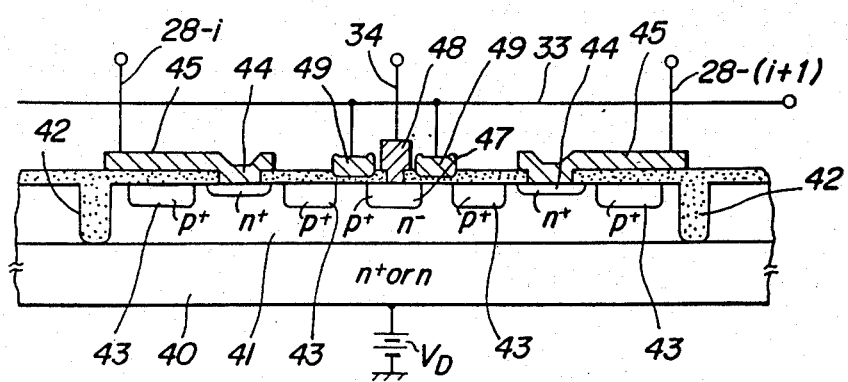

FIG. 5A is a plan view showing adjacent four pixels of the solid state image sensor shown in FIG. 4 and FIG. 5B is a cross sectional view cut along a line A—A' in FIG. 5A. In the present embodiment, in order to increase the integration efficiency of pixels formed on a substrate 40, the four adjacent pixels are formed symmetrically with respect to a center point as shown in FIG. 5A. The substrate 40 constitutes drains of SITs and is formed by n+ or n type semiconductor material. On the substrate 40 is grown an n− expitaxial layer 41 in which an isolation region 42 made of, for instance, insulating material is formed to electrically and optically isolate adjacent pixels from each other. In each pixel, source and drain of the SIT are formed by p+ and n+ diffusion layers 43 and 44, respectively, formed in the surface of epitaxial layer 41. The n+ source diffusion layers 44 are connected by means of wiring conductive layers 45 made of, for instance, polysilicon to column lines 28-i, 28-(i+1). On the p+ gate diffusion layers 43 are formed gate oxide films on which row line electrodes 46-i, 46-(i+1) are further applied to form gate capacitors between the p+ diffusion layers 43 and row line electrodes 46-i, 46-(i+1). The row line electrodes 46-i and 46-(i+1) are connected to the row lines 26-i and 26-(i+1), respectively.

As illustrated in FIG. 5A, the p+ gate diffusion layers 43 are extended up to a center region of the four adjacent pixels and the extended portions of p+ diffusion layers 43 are utilized as sources of respective control transistors. In the epitaxial layer 41 at the central region of the adjacent four pixels, there is formed a p+ diffusion layer 47 separate from the p+ diffusion layer 43 serving as the gates of SITs and sources of control transistors, the p+ diffusion layer 47 constituting the drains of control transistors of four adjacent pixels. The p+ diffusion layer 47 is connected to the overflow drain line 34 via a wiring electrode 48. On a portion of the expitaxial layer 41 situated between the p+ diffusion layers 47 and 43, there is provided via a gate oxide film a control gate electrode 49 forming the control gate line 33 common to for the four adjacent pixels.

Now the operation of the solid state image sensor of the present embodiment will be explained with reference to signal waveforms shown in FIGS. 6A to 6I. In the present embodiment, the pixels are successively read out by the XY address method by successively selecting the row lines 26-1 to 26-m and column lines 28-1 to 28-n. During the scanning of a row, after a readout period $t_H$, all the pixels belonging to a respective row are simultaneously reset during a horizontal blanking period $t_{BL}$. Now, the operation of a single pixel 21-22 will be explained. At a timing $t_1$, when the row selection signal $\phi_{G2}$ having a voltage $V_{\phi G}$ (FIG. 6B) is applied to the row line 26-2 from the vertical scanning circuit 27, the potential $V_{G(2,2)}$ of floating gates of the SITs connected to the relevant row line 26-2 is increased substantially by $V_{\phi G}$ as illustrated in FIG. 6I. More precisely, the floating gate potential is increased by $$\frac{C_G}{C_J + C_G} \cdot V_{\phi G}$$

wherein $C_G$ is a capacitance of the gate capacitor 24 and $C_J$ is a stray diffusion capacitance of the p+ gate diffusion layer 43.

At time $t_2$, when the column selection signal $\phi_{s2}$ applied to the column line 28-2 is changed into a high level as depicted in FIG. 6E, the relevant pixel 21-22 is selected and a signal current having an amplitude corresponding to the gate potential $V_{G(2,2)}$ shown in FIG. 6I flows through the load resistor 31 via the column selection transistor 29-2 and video line 30. Thus, the output signal voltage $V_{out}$ is obtained as a voltage drop across the load resistor 31. During this readout operation, the photocarriers stored in the floating gate are maintained constant, and therefore it is possible to effect a so-called nondestructive readout.

At time $t_3$ after the last column line 28-n has been selected and all the pixels 21-21 to 21-2n belonging to the respective row line 26-2 have been read out, i.e. at a beginning of the horizontal blanking period $t_{BL}$ as illustrated in FIG. 6H, the control gate signal $\phi_c$ applied to the control line 33 is changed from zero volts to a voltage $=V_{\phi c}$ at which the control transistor is made conductive. Then, a surface potential $\phi_s$ immediately below the control gate electrode 49 of control transistor is changed from $\phi_s(0)$ to $\phi_s(-V_{\phi c})$ and the gate potential is clamped to the value $\phi_s(-V_{\phi c})$ to effect the resetting operation. In this manner, photocarriers $Q_p$ which have been stored in the gate of the SIT after the signal readout timing are discharged. It should be noted that the voltage $-V_{\phi c}$ of the control gate signal $\phi_c$ is so determined that the surface potential $\phi_s(-V_{\phi c})$ below the control gate electrode 49 is substantially equal to the pinch-off voltage $V_{GO}$ of the SIT and is higher than the control drain voltage $V_c(\phi_s(-V_{\phi c}) > V_c)$.

At time $t_4$, i.e. at an end of the horizontal blanking period $t_{BL}$, the row selection signal $\phi_{G2}$ is changed into the original low level and the control gate signal $\phi_c$ is increased to zero volts. Then the floating gate potential $V_{G(2,2)}$ of the SIT of the respective pixel 21-22 is decreased to $\phi_s(-V_{\phi c}) - V_{\phi G}$. After that, the floating gate potential is gradually increased by $Q_p/C_G(\equiv \Delta V_{Gp})$ in accordance with the integration of photocarriers induced during a subsequent image pick-up period.

In the present embodiment, the control gate signal $\phi_c$ is applied not only to the control electrodes of the pixels connected to the selected row line, but also to the control gate electrodes of all the pixels which are not selected. Therefore, when the control gate signal $\phi_c$ is changed to the voltage $-V_{\phi c}$, the surface potentials below the control gate electrodes of control transistors of all the non-selected pixels are also changed to the voltage $\phi_s(-V_{\phi c})$ which is substantially equal to the pinch-off voltage $V_{GO}$ of a SIT. Therefore, even if the floating gate potential at one or more non-selected pixels is increased by an amount $\Delta V_{Gp}$ larger than $V_{\phi G}$ due to strong light and thus $\phi_s(-V_{\phi c})-V_{\phi G}+\Delta V_{Gp}>\phi_s(-V_{\phi c})$ i.e. $\Delta V_{Gp}>V_{\phi G}$, the portion of stored photocarriers which exceeds the potential $\phi_s(-V_{\phi c})$, i.e. the pinch-off voltage $V_{GO}$ of the SIT, is discharged into the overflow drain line 34 via the channel below the control gate. This overflow operation of photocarriers is effected at all the selected and non-selected pixels every time the successive row lines are scanned. Therefore, even when strong light is made incident upon the solid state image sensor, the floating gate potential does not exceed the pinch-off voltage $V_{GO}$, so that the half selection signal phenomenon can be effectively prevented. This can be recognized to be identical with a blooming control. Further, since the pixel is reset by clamping the floating gate potential of the SIT to $\phi(-V_{\phi c})$ with the aid of the control gate signal $\phi_c$, residual photocarriers remaining after the resetting operation can be nulled. Therefore, according to the present embodiment, the so-called after image phenomenon can be completely eliminated. Contrary to this, in the known solid state image sensor in which the pixel is reset by forwardly biasing a pn junction between the gate and source of a SIT, there always remains a few percent of the after image phenomenon.

In the above explained embodiment of the solid state image sensor according to the invention, the row selection signal applied to the row lines is a bivalent signal, and during the horizontal scanning period $t_{BL}$, the row selection signal has the same voltage $V_{\phi G}$ as that applied during the signal readout period $t_H$. However, in a second embodiment of the solid state image sensor according to the invention which will be explained hereinbelow with reference to FIGS. 7A to 7I, use may be made of a trivalent row selection signal which has a lower voltage $V_{\phi GR}$ during the horizontal blanking period than a voltage $V_{\phi G}$ during the signal readout period $t_H$.

In the present embodiment, as shown in FIG. 7I, at a time $t_3$, the control transistor is made conductive and the floating gate potential $V_{G(2,2)}$ of a SIT of a pixel 21-22 shown in FIG. 4 is clamped to $\phi(-V_{\phi c})$ by the control signal $\phi_c$ and thus the gate potential is reset. Next, at a time $t_4$, the row selection signal $\phi_{G2}$ becomes a low level of $V_{\phi GR}$, the floating gate potential $V_{G(2,2)}$ is decreased also by $V_{\phi GR}$ and becomes equal to $\phi_s(-V_{\phi c})-V_{\phi GR}$. After that, at a time $t_1$ at which the row line 26-2 is again selected as illustrated in FIG. 7B, the row selection signal $\phi_{G2}$ is changed to the readout voltage $V_{\phi G}$, and the floating gate potential $V_{G(2,2)}$ is increased by $V_{\phi G}$ and becomes equal to $\phi_s(-V_{\phi c})-V_{\phi GR}+V_{\phi G}$. Also in the present embodiment, $\phi_s(-V_{\phi c})$ is selected to be substantially equal to the pinch-off voltage $V_{GO}$ of a SIT, i.e.

$$\phi_s(-V_{\phi c})+(V_{\phi G}-V_{\phi GR})=V_{GO}+(V_{\phi G}-V_{\phi GR})=V_{G1}>V_{GO}$$

Next, at a time $t_2$, when the column selection signal $\phi_{s2}$ shown in FIG. 7E is changed to a high level, there is obtained an output signal voltage $V_{out}$ having an amplitude corresponding to the floating gate voltage $V_{G(2,2)}$. It should be noted that even if no light is made incident during the image pick-up period, the floating gate voltage of a SIT is increased to $V_{G1}$ exceeding the pinch-off voltage $V_{GO}$ as shown in FIG. 8B, and thus a signal output current $I_D(V_{G1})$ flows to produce an offset voltage. In the present embodiment, the off-set voltage is removed from the signal output voltage $V_{out}$ by utilizing an output voltage from a dummy pixel upon which the incident light is not made incident. In this manner, the image signal can be derived accurately.

In the present embodiment, the non-linearity of the photoelectric converting characteristic in a low incident light region of the known sensor shown in FIG. 3A can be improved to a great extent as illustrated in FIG. 8A. In this manner, it is possible to derive the image signal accurately corresponding to the incident light.

FIG. 9 is a circuit diagram showing a whole construction of another embodiment of the solid state image sensor according to the invention. In this embodiment, portions similar to those of the embodiment illustrated in FIG. 4 are denoted by the same reference numerals as those used in FIG. 4, and the explanation for these similar portions is omitted. In the present embodiment, the control gate electrodes of control transistors 25 of pixels 21-11 to 21-m1; ... 21-1n to 21-mn arranged in a column are connected to respective additional column lines 51-1 to 51-n which are connected to a resetting horizontal scanning circuit 52 to receive respective control gate signals $\phi_{c1}$ to $\phi_{cn}$. The selection of additional column lines with the aid of the control gate signals $\phi_{c1}$ to $\phi_{cm}$ is delayed by a time period equal to any integer multiple of the column line selection period with respect to the selection of the column lines 28-1 to 28-n with the aid of the horizontal scanning circuit 32. As will be explained hereinbelow, in the present embodiment the selection of the additional column lines 51-1 to 51-n is delayed by just one column selection period.

Now, the operation of the solid state image sensor shown in FIG. 9 will be explained with reference to signal waveforms shown in FIGS. 10A to 10I. The operation of the present embodiment is basically same as that of the previous embodiment shown in FIG. 4 except for the timing of the application of the control gate signals $\phi_{c1}$ to $\phi_{cn}$. That is to say, at a time $t_1$, the floating gate potential $V_{G(2,2)}$ of pixel 21-22 is increased by the voltage $V_{\phi G}$ as illustrated in FIG. 10I, and at a time $t_2$ pixel 21-22 is readout as shown in FIG. 10D. Next, at a time $t_3$, the control gate signal $\phi_{c2}$ having an amplitude $-V_{\phi c}$ shown in FIG. 10F is applied to the control gage electrode of the control transistor of the respective pixel 21-22 to make the control transistor of this pixel conductive. Therefore, the surface potential under the control gate electrode is changed to $\phi_s(-V_{\phi c})$ and the floating gate potential $V_{G(2,2)}$ of the SIT is clamped to $\phi_s(-V_{\phi c})$ so as to reset the gate potential of the SIT. When the control gate voltage $\phi_{c2}$ returns to zero volts as shown in FIG. 10G, the accumulation of photocarriers induced by incident light is initiated. At a time $t_4$, when the row selection signal $\phi_{G2}$ is decreased to the low value $V_{\phi G}$ as depicted in FIG. 10B, the floating gate potential $V_{G(2,2)}$ is also decreased to $V_{\phi G}$. After that, the photocarriers are stored in the gate until the relevant pixel is next read out.

In the present embodiment, the advantages obtained in the embodiment shown in FIG. 4 can be also attained. Further, since the pixels on the same row line which are readout successively are reset also successively in synchronism with the readout, it is possible to make all the photocarrier integration periods at all the pixels identical with each other and therefore, it is possible to derive the image signal much more accurately relative to the incident light.

FIGS. 11A to 11F are signal waveforms for explaining the operation of still another embodiment of the solid state image sensor according to the invention which has the same construction as that shown in FIG. 9. In the present embodiment, there may be realized a so-called electronic shutter function by reducing the image pick-up period, i.e. the photocarrier integration period.

At a time $t_1$ at which the selection of the last row has been completed and the horizontal blanking period $t_{BL}$ for the last row starts, to the first row line 26-1 is applied the row selection signal $\phi_{G1}$ having a pulse period equal to the horizontal blanking period $t_{BL}$ and a pulse amplitude equal to $V_{\phi G}$ as shown in FIG. 11A, the row selection signal serving as the reset pulse. At the same time, to the control gate electrodes of the control transistors of all the pixels is simultaneously applied the control gate signal $\phi_c$ having the amplitude $-V_{\phi c}$ shown in FIG. 11F to reset all the pixels connected to the first row line 26-1. Therefore, a period $T_1$ is a reset period for the first row line 26-1 and a period $T_2$ is a reset period for a second row line 26-2. While the pixels connected to the first row line 26-1 are reset during the period $t_{BL}$, the overflow function for the photocarriers which might cause the floating gate potential to exceed the voltage $\phi_s$ ($-V_{\phi c}$) is effected in all the pixels connected to all non-selected row lines 26-2 to 26-$m$, and similarly during the resetting operation for the second row line 26-2, the overflow function is carried out in all the pixels connected to the non-selected row lines 26-1, 26-3 to 26-$m$. In this manner, also in the present embodiment, it is possible to effectively prevent the half section signal phenomenon.

The resetting operation for pixels connected to the first row line 26-1 is finished at a time $t_2$, and then the photocarriers induced by the incident light are accumulated for a period $T_{11}$ until a time $t_3$ at which the row selection signal $\phi_{G1}$ becomes $V_{\phi G}$ as shown in FIG. 11A and a signal readout period $T_3$ for the first row starts. Similarly, the resetting operation for pixels connected to the second row line 26-2 is completed at a time $t_4$ and the integration of photocarriers is effected for a period $T_{22}$ until a time $t_5$ at which the row selection signal $\phi_{G2}$ is increased to $V_{\phi G}$ as depicted in FIG. 11B and a signal readout period $T_4$ for the second row is started. By suitably controlling the vertical scanning circuit 27, the pixels belonging to successive row lines are readout during successive signal readout periods $T_3$, $T_4$ ..., while the integration periods, i.e. the image pick-up periods $T_{11}$, $T_{22}$ ... for successive row lines are made identical with each other ($T_{11}=T_{22}$ ...) and made equal to any integer multiple of the row selection period. It should be noted that in the present embodiment during a horizontal blanking period $t_{BL}$ of a signal readout period for a row line, for instance the period $T_3$, resetting operations are effected for the pixels of the remaining row lines in a manner similar to that explained above with reference to the signal readout period $T_1$.

In the present embodiment, the image pick-up period, i.e. the photocarrier accumulation period can be set to any desired period which is equal to any integer multiple of the row selection period and thus the electronic shutter function may be attained. Therefore, it is possible to derive an excellent image signal by means of which a sharp picture can be displayed even if an object moves rapidly. In this case, the photocarrier integration periods of the first and last pixels belonging to the same row line are not strictly made identical with each other, but differ from each other substantially by a horizontal scanning period. For instance, when the shutter speed ($T_{11}=T_{22}$...) is set to about $1/1,000$ sec $=10^{-3}$ sec and the horizontal scanning period is equal to about $52\mu$ sec $=52\times10^{-6}$ sec in the standard television signal, a difference in the image pick-up periods for the first and last pixels will amount only $52\times10^{-6}/10^{-3}\times100=5.2\%$. Therefore, said difference does not produce any inconvenience and can be ignored. Further, such a small difference in the image pick-up time may be corrected by a relatively simple signal processing circuit, if necessary.

In a modified embodiment, the row selection signal may have the rest pulse amplitude of $V_{\phi GR}$ as shown by a broken line in FIG. 11B during the period $t_{BL}$. Then it is possible to attain the same advantage as that explained with reference to FIGS. 7A to 7I by setting $V_{\phi G}-V_{\phi GR}=V_{G1}-V_{GO}$ and by removing the off-set voltage due to the change of the gate voltage from $V_{GO}$ to $V_{G1}$ during the signal readout period.

Figure 12:
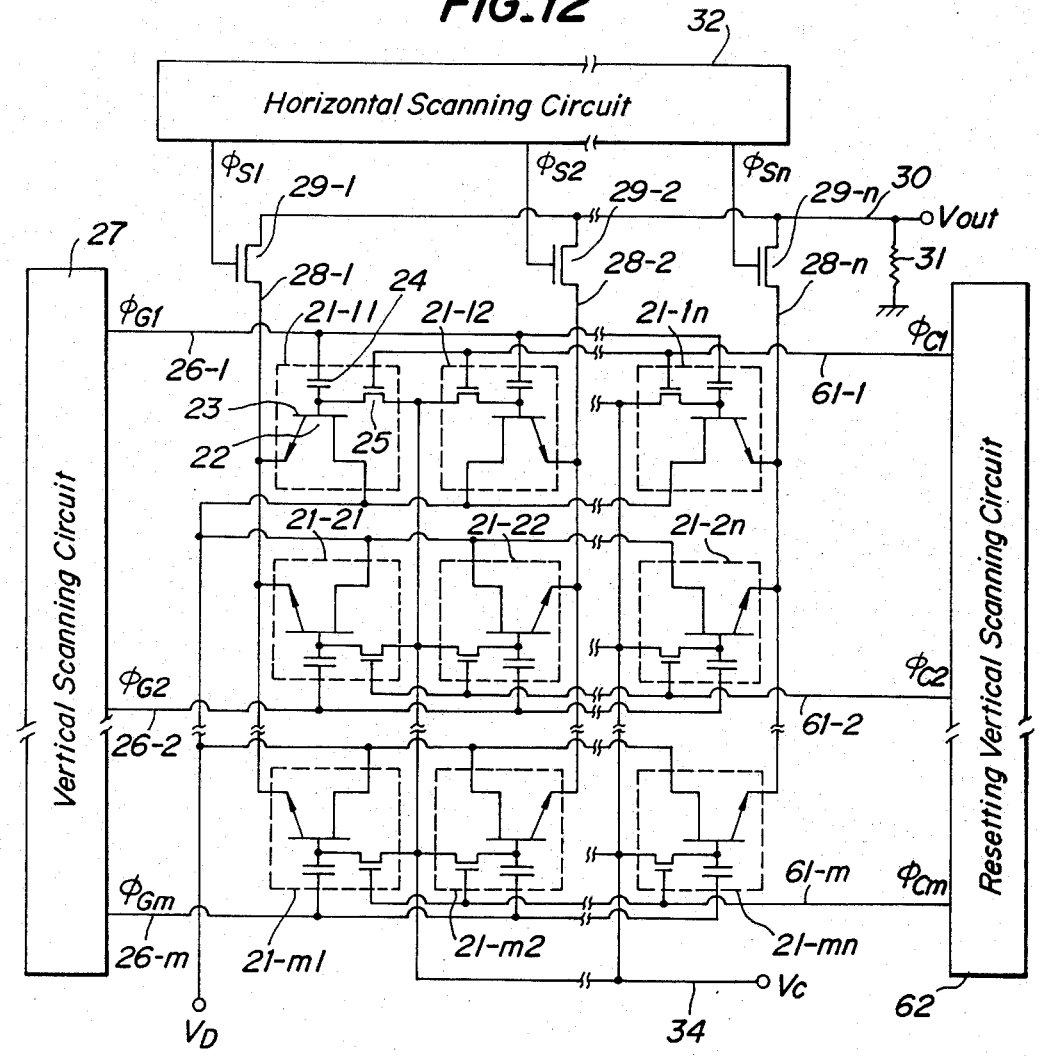
FIG. 12 is a circuit diagram depicting the whole construction of still another embodiment of the solid state image sensor according to the invention.

FIG. 12 is a circuit diagram showing a whole construction of still another embodiment of the solid state image sensor according to the invention. Also in the present embodiment, portions similar to those shown in FIG. 4 are denoted by the same reference numerals used in FIG. 4 and their explanation is omitted. In the present embodiment, the control gate electrodes of control transistors 25 of pixels 21-11 to 21-1$n$; ...; 21-$m$1 to 21-$mn$ of respective row lines are connected to respective additional row lines 61-1 to 61-$m$ to which the control gate signal $\phi_{c1}$ to $\phi_{cm}$ are applied from a resetting vertical scanning circuit 62. Each of the control gate signals $\phi_{c1}$ to $\phi_{cm}$ is a trivalent signal having three different voltages $-V_{\phi c1}$, $V_{\phi c2}$ (generally $V_{\phi c2}>0$) and $-V_{\phi c3}$. The control gate signal assumes the voltage $V_{\phi c2}$ prior to the selection of a row line by means of the veritcal scanning circuit 27, assumes the voltage $-V_{\phi c3}$ from an end of the signal readout of the last pixel in the relevant row line to a start instant of the selection of a next row line, and assumes the voltage $-V_{\phi c1}$ in the remaining period.

Now the operation of the solid state image sensor will be expalined with reference to the waveforms shown in FIGS. 13A to 13L. At a time $t_1$, the control gate signal $\phi_{c2}$ applied to the second additional row line 61-2 is changed from $-V_{\phi c1}$ to $V_{\phi c2}$ as illustrated in FIG. 13I. Immediately after that, at a time $t_2$, the row selection signal $\phi_{G2}$ is changed to the voltage $V_{\phi G}$ as depicted in FIG. 13B and thus the floating gate potential $V_{G(2,2)}$ of a SIT of a pixel 21-22 is changed to a sum of an increment voltage $\Delta V_{GP}$ due to the accumulation of photocarriers during the image pick-up period and the voltage $V_{\phi G}$ of the row selection signal $\phi_{G2}$ as shown in FIG. 13J. Next, at a time $t_3$, when the column selection signal $\phi_{s2}$ is changed to a high level as depicted in FIG. 13E, the image signal is readout of the relevant pixel 21-22. Since the time $t_1$ at which the control gate signal $\phi_{c2}$ is changed to the voltage $V_{\phi c2}$ is prior to the time at which the row selection signal $\phi_{G2}$ is changed to the voltage $V_{\phi G}$, the photocarriers which have been stored in the gate regions of SITs of pixels 21-21 to 21-2$n$ connected to the row line 26-2 are effectively prevented from being discharged into the control gate potential $V_c$ through the channels of control transistors even when the gate potentials of the SITs are increased at the time $t_2$.

Next, at a time $t_4$ at which the last pixel 26-2$n$ of the row line 26-2 has been read out, the control gate signal $\phi_{c2}$ assumes the voltage $-V_{\phi c3}$ as illustrated in FIG.

13I. The voltage $-V_{\phi c3}$ is so determined that the control transistor is made conductive by this voltage and further the surface potential $\phi_s(-V_{\phi c3})$ below the control gate electrode is made less than the control drain voltage $V_c$. Therefore, at the time $t_4$ the gate potentials of the SITs of pixels 21-21 to 21-2n connected to the row line 26-2 is changed to the control drain voltage $V_c$ instead of the voltage $\phi_s(-V_{\phi c3})$, so that the gate potentials are reset.

After that, at a time $t_5$ when the row selection signal $\phi_{G2}$ is changed to a low level, the floating gate potential of the SIT of the pixel 21-22 is decreased by $V_{\phi G}$ and becomes equal to $(V_c-V_{\phi G})$ as shown in FIG. 13J. From a time $t_6$ immediately after the time $t_5$ to a time immediately before the row line 26-2 is selected again, the control gate voltage $\phi_{c2}$ remains the voltage $-V_{\phi c1}$ as shown in FIG. 13H. It should be noted that the voltage $-V_{\phi c1}$ is determined such that the surface potentials $\phi_s(-V_{\phi c1})$ generated below the control gate electrode of the control transistor upon the application of the voltage $-V_{\phi c1}$ is made equal to the pinch-off voltage $V_{GO}$ of a SIT.

In the present embodiment, it is possible to effectively prevent the occurrence of the half selection signal phenomenon as in the previous embodiments. Further, since the pixel is reset by clamping the gate potential of a SIT to the control drain voltage $V_c$, it is possible to remove any possible fluctuation of reset voltage due to the variation in the thickness of the insulating film under the control gate electrode, or the variation in the interface level density. Moreover, in the present embodiment, by modifying the control drain voltage $V_c$ to the voltage $V_{G1}$ similar to the embodiment shown in FIGS. 7A to 7I, it is possible to improve the linearity of the photoelectric converting characteristic in a region of small incident light. Further, by modifying the control gate signals $\phi_{c1}$, $\phi_{c2}$ into signals $\phi'_{c1}$, $\phi'_{c2}$ shown in FIGS. 13K, 13L, it is possible to simplify the construction of the resetting vertical scanning circuit 62. It should be noted that in the case of using the control gate signals $\phi'_{c1}$, $\phi'_{c2}$, the effective image pick-up period is shortened by the row selection period.

The present invention is not limited to the embodiments explained above, but many modifications and alternations may be conceived by those skilled in the art within the scope of the invention. For instance, in the embodiments so far explained the pixel is formed by n channel SIT and P channel control transistor, but it may be composed of a P channel SIT and n channel control transistor. Further, the pixel signal may be read out by means of a common drain readout method in which the drain is connected to the ground and the source is connected to the position voltage source via the load resistor, instead of the source follower readout method in which the drain is connected to the positive voltage source and the source is connected to ground via the load resistor. Moreover, the SITs and control transistors constituting the pixels may be formed separately on the same substrate or on separate substrates. Then gates of SITs may be connected to the source-drain passages of the control transistors by means of wiring conductors.

As explained above in detail, according to the invention since each of pixels of the solid state image sensor is formed by a SIT and a control transistor whose source-drain passage is connected the gate of SIT, it is possible to effectively prevent the half selection signal phenomenon even if strong light is made incident upon the solid state image sensor, and the signal current readout of a selected pixel is not affected by a current supplied from one or more non-selected pixels upon which the strong light is made incident.

What is claimed is:

1. A solid state image sensor comprising:
   a plurality of row lines;
   a plurality of column lines;
   a plurality of pixels, each pixel comprising a normally-on type static induction transistor having gate, source and drain and a control transistor having a source-drain passage connected to said gate of said static induction transistor, said gate storing photocarriers induced by incident light, said static induction transistors and control transistors of pixels being formed on a same substrate and being arranged at cross points of the row and column lines;
   means for scanning the pixels to readout an image signal by selectively making conductive the static induction transistors; and
   means for selectively making conductive one or more control transistors of pixels which are not selected by the scanning means, and for discharging through the source-drain passages of the respective control transistors of non-selected pixels exceess amounts of stored photocarriers over a pinch-off voltage of the static induction transistors of said non-selected pixels;
   wherein adjacent four pixels are formed symmetrically with respect to a center region whereby first sources and drains of four control transistors of said four pixels are constituted by a common region formed in said center region and each of the others of sources and drains of four control transistors are formed integrally with each of the gates of respective static induction transistors of each of said four pixels.

2. A solid state image sensor according to claim 1, wherein said discharging means comprises a reset line to which control gate electrodes of control transistors of all the pixels are commonly connected, an overflow line to which the source-drain passages of control transistors of all the pixels are commonly connected, and means for applying a reset signal to said reset line during a horizontal blanking period to discharge the photocarriers into said overflow line.

3. A solid state image sensor according to claim 2, wherein said reset signal has such a value that a surface potential generated below the control gate electrode is substantially equal to the pinch-off voltage of the static induction transistor.

4. A solid state image sensor according to claim 2, wherein during the horizontal blanking period of a row selection signal has a value less than the value of the row selection signal during a signal readout period.

5. A solid state image sensor according to claim 1, wherein said discharging means comprises a plurality of additional column lines to which control gate electrodes of control transistors of pixels arranged in respective columns are commonly connected, an overflow line to which the source-drain passages of control transistors of all the pixels are commonly connected, and a resetting horizontal scanning circuit for applying successively reset signals to said additional column lines in synchronism with signal readout by means of said scanning means to discharge the photocarriers into the overflow line.

6. A solid state image sensor according to claim 5, wherein a discharge of photocarriers into the overflow line for a pixel is effected immediately after the respective pixel has been readout.

7. A solid state image sensor according to claim 5, wherein a discharge of photocarriers into the overflow line for a pixel is effected prior to a signal readout for the relevant pixel by a time period equal to any integer multiple of a horizontal scanning period.

8. A solid state image sensor according to claim 1, wherein said discharging means comprises a plurality of additional row lines to which control gate electrodes of control transistors of pixels arranged in respective rows are commonly connected, an overflow line to which the source-drain passages of control transistors of all the pixels are commonly connected, and a resetting vertical scanning circuit for applying successively reset signals to said additional row lines in synchronism with signal readout by means of said scanning means to discharge the photocarriers into the overflow line.

9. A solid state image sensor according to claim 8, wherein a discharge of photocarriers into the overflow line for pixels belonging to a row line is effected immediately after the relevant pixels have been read out.

10. A solid state image sensor according to claim 8, wherein a discharge of photocarriers into the overflow line for pixels belonging to a row line is effected while pixels belonging to a successive row line are read out.

* * * * *